United States Patent [19]

Tanaka

[11] 4,302,778
[45] Nov. 24, 1981

[54] AFT-WIDE AUTOMATIC FREQUENCY CONTROL SYSTEM AND METHOD

[75] Inventor: Akio Tanaka, San Francisco, Calif.

[73] Assignee: Zenith Radio Corporation, Glenview, Ill.

[21] Appl. No.: 164,716

[22] Filed: Jun. 30, 1980

[51] Int. Cl.³ .............................................. H04N 5/50
[52] U.S. Cl. ................................................. 358/195.1
[58] Field of Search ...................... 358/195.1; 455/182, 455/192, 265

[56] References Cited

U.S. PATENT DOCUMENTS

| | | | |
|---|---|---|---|
| 3,949,158 | 4/1976 | Rzeszewski et al. | 358/195.1 |
| 3,952,143 | 3/1976 | Siwko | 358/195.1 |
| 4,163,259 | 7/1979 | Skerlos | 358/195.1 |

Primary Examiner—Richard Murray
Attorney, Agent, or Firm—Thomas E. Hill

[57] ABSTRACT

An indirect frequency synthesis, microcomputer-controlled tuning system utilizing a frequency stepping process to tune to a selected channel frequency is disclosed. AFC discriminator information relating to a predetermined frequency range around the correct nominal frequency for the selected channel and the tuning direction toward the nominal frequency is provided to the microcomputer for frequency-stepping the tuner along the AFC discriminator curve in tuning to the selected channel. Vertical sync verification of the detected carrier signal provides more reliable carrier signal detection with the frequency-stepping procedure resumed upon invalid carrier detection. If a limit of the tuning range is reached, tuning is immediately switched to the other limit with the frequency-stepping procedure resumed in the original direction following a predetermined system stabilizing period.

16 Claims, 10 Drawing Figures

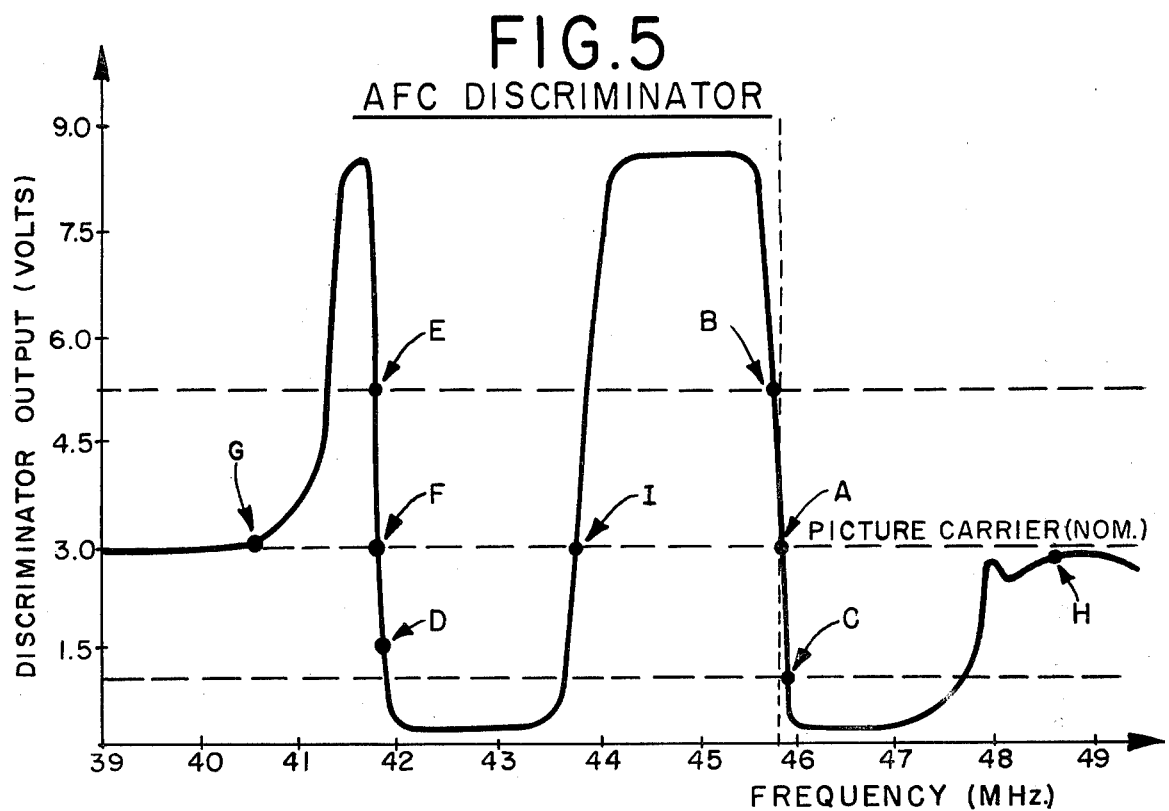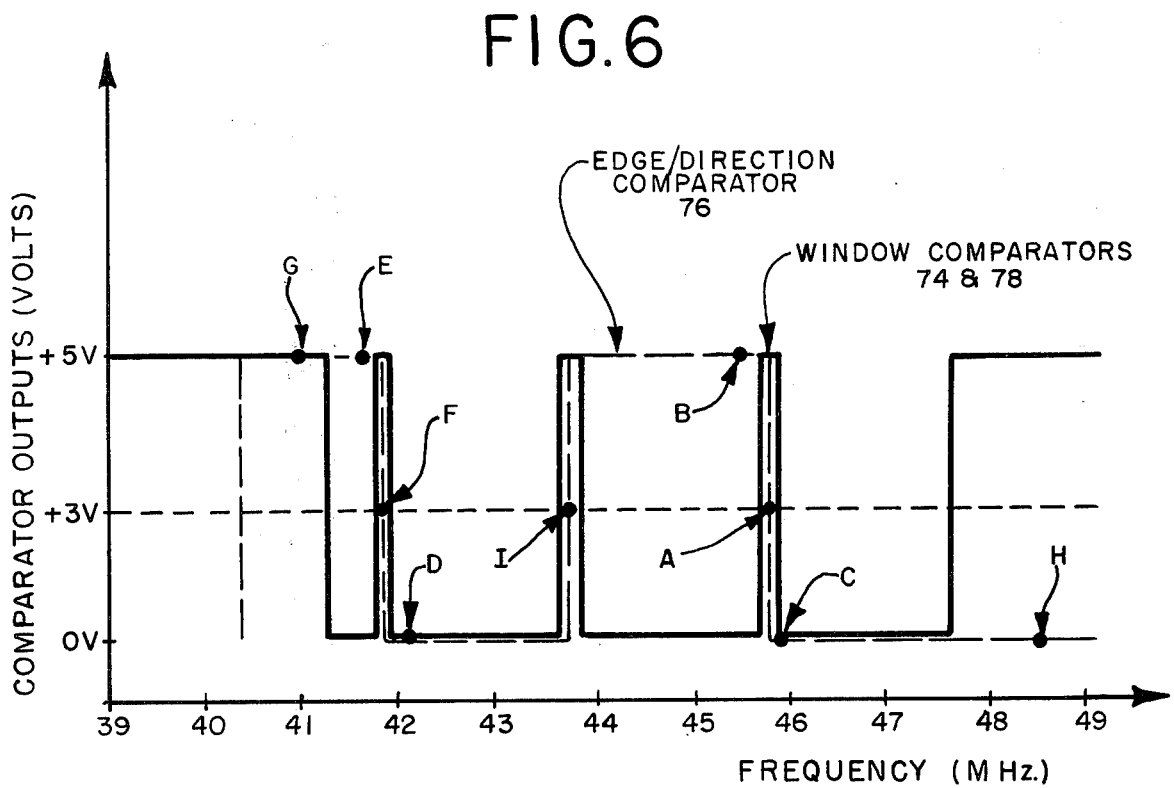

AFT-WIDE AUTOMATIC FREQUENCY CONTROL SYSTEM AND METHOD

CROSS REFERENCE TO RELATED APPLICATIONS

This application is related to but in no way dependent upon the following applications which are assigned to the assignee of the present application: Ser. No. 107,732, filed Feb. 19, 1980, entitled "Microcomputer-Controlled One-Step-Back Automatic Frequency Control Tuning System," in the name of Peter C. Skerlos; and Ser. No. 145,153, filed Apr. 30, 1980, entitled "Vertical Synchronization Detection System and Method" in the name of applicant.

BACKGROUND OF THE INVENTION

This invention relates generally to electronic tuning systems for television receivers and methods therefore, and more particularly relates to an indirect frequency synthesis television tuning system and method in which automatic frequency control is provided over the entire automatic fine tuning range.

The use of indirect frequency synthesis in television tuning systems is increasing because of the inherent advantages of this frequency tuning approach. The indirect frequency synthesis tuning system utilizes a phase lock loop (PLL) that employs the local oscillator (LO, of the tuner for its voltage controlled oscillator (VCO). A stable, accurate reference signal is generated by a crystal oscillator and compared to the output of the LO that has been divided down in frequency in the PLL. By counting down from the LO which provides one input to the phase comparator, the PLL causes the signal thus produced to be exactly the same frequency as the reference signal which provides the other input to the phase comparator. The two signals will be slightly out of phase due to the static phase error of the PLL. With the PLL forcing both of the inputs to the phase comparator to be equal in frequency, a change in the division ratio between the LO and the phase comparator will result in a different LO frequency.

With the availability of electronic television tuning systems employing voltage synthesis, extremely accurate tuning voltages may be thus generated but tuner drifts will result in the same tuner producing different LO frequencies at different times even though exactly the same tuning voltage is applied. As a result of these inherent inaccuracies in a voltage synthesis system, automatic fine tuning (AFT) circuitry is generally provided in combination with a frequency discriminator. The frequency discriminator is characterized by an AFC S-tuning curve whereby the tuned-to frequency is determined by the input synthesized tuning voltage. This S-curve determines the system's frequency as a function of applied tuning voltage and, because of its S-shape, can result in tuning to false signals unless additional signal detection and verification means are provided. Without these additional signal detection and verification means, for example, several signals of different frequency may be tuned to by a television tuning system using the same tuning voltage input.

The present invention is intended to avoid these signal tuning problems by providing an indirect frequency synthesis system which is controlled by a microcomputer and which offers automatic frequency control over the entire automatic fine tuning range of the tuner.

OBJECTS OF THE INVENTION

Accordingly, it is an object of the present invention to provide an improved system and process for tuning a television receiver to a selected channel.

It is another object of the present invention to provide an improved tuning system and method for a television receiver in which automatic frequency control is available over the tuner's entire automatic fine tuning range.

Still another object of the present invention is to provide an improved system and method for accurately tuning a television receiver to a selected channel by means of microcomputer control in which several received signal parameters are analyzed by means of an AFC discriminator for increased channel tuning accuracy and reliability.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings in which:

FIG. 5 shows in greater detail an S-tuning curve of the AFC discriminator employed in the present invention wherein various points on the curve are selected to assist in explaining the operation of the present invention; and FIG. 6 shows the polarity reversal curves for the window and edge, or direction, comparators in which various points on the curves corresponding to those points depicted in FIG. 5 are emphasized for the purpose of explaining the operation of applicant's invention.

DESCRIPTION OF THE PREFERRED EMBODIMENT

Figure 1:
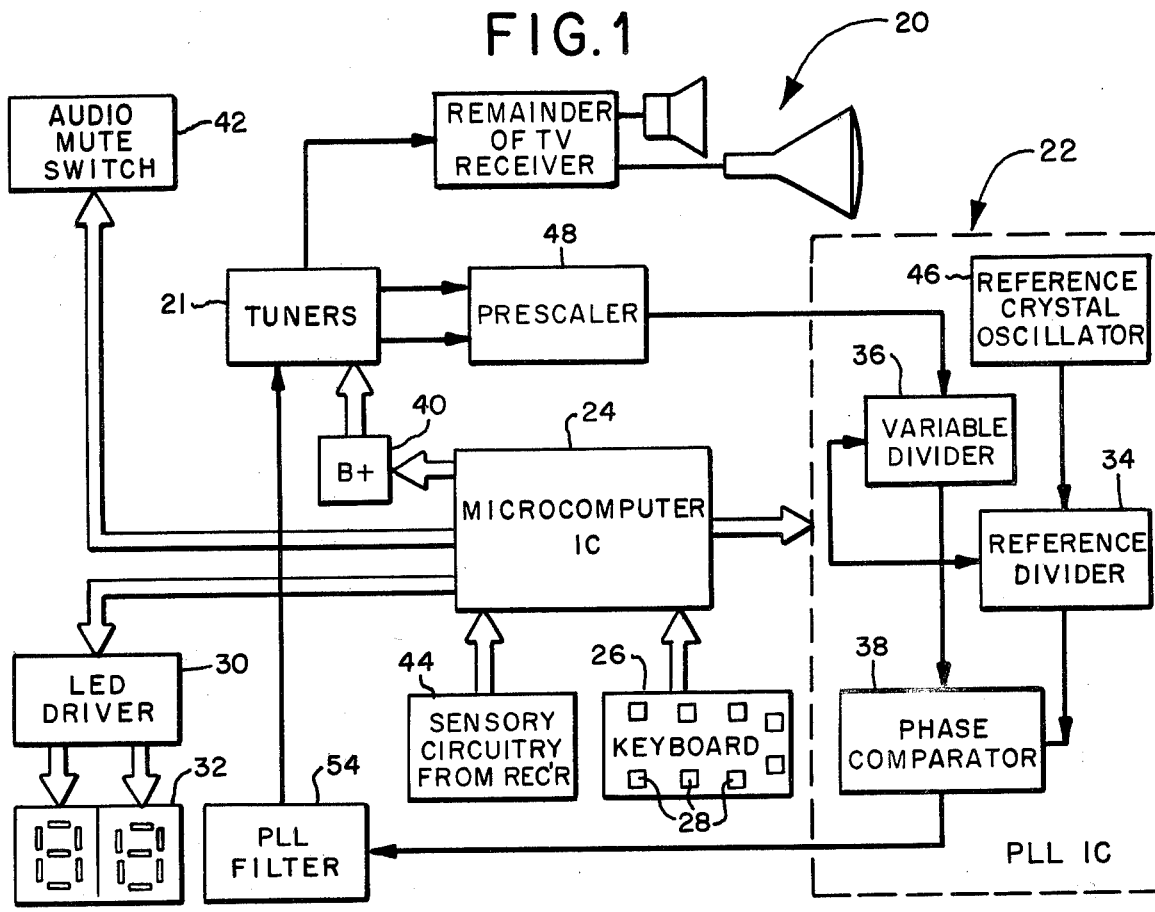
FIG. 1 is a simplified block diagram of a television tuning system incorporating automatic frequency control over the entire automatic fine tuning range in accordance with the present invention.

Referring to the block diagram of FIG. 1, the AFT-wide automatic frequency control system 20 uses varactor tuners with a local oscillator 21 in conjunction with a phase lock loop (PLL) 22 to maintain crystal accuracy and stability of selected channels. A microcomputer 24 provides information storage, decision making logic and system control. Channel selection is made by keyboard 26 or by remote control (not shown) entry. Touch pads, or keys, 28 on the front panel of keyboard 26 provide direct entry of two digits to microcomputer 24. When the desired channel digits are entered the following events occur: (1) a microcomputer output signal to LED drivers 30 activates the proper LED segments 32 to display the channel number selected; (2) microcomputer 24 loads the correct divide ratio for the selected channel into the reference divider 34 and the variable divider 36 of the PLL 22 which alters its input frequency to the phase comparator 38; (3) microcomputer 24 determines whether the channel selected is low VHF, high VHF, or UHF and applies the proper outputs to the U/V B+ switch and the VHF Hi/Lo band switch 40; and (4) microcomputer 24 activates the audio mute switch 42. The sensory circuits 44 receive several inputs such as 45.75 MHz (picture carrier), 41.25 MHz (audio carrier), vertical sync, composite video and AFC voltage, and perform logic functions which provide signals to microcomputer 24 indicating whether or not a broadcast signal is present and how accurately it is tuned.

Indirect frequency synthesis is utilized in the AFT-wide automatic frequency control system 20 in which a PLL 22 utilizes the tuner local oscillator (LO) 21 as its voltage controlled oscillator (VCO). In PLL 22, the reference crystal oscillator 46 frequency of 3.581055 MHz is divided by a 14 stage divider network, the reference divider or counter 34, to provide a 976.5626 Hz signal to the phase comparator 38. The other input to the phase comparator 38 is provided by the local oscillator in tuner 21. The frequency division chain from the local oscillator in tuner 21 to phase comparator 38 is composed of a fixed divide by 256 prescaler 48, a fixed divide by four in the PLL chip, and a ten stage variable divider or counter 36 in the PLL. The variable divider 36 divides by the numerical value of the frequency of the local oscillator in megahertz for the channel selected. The reference crystal oscillator 46 drives twelve stages of memory which are connected as an eight stage variable load and a four stage fixed load as reference counter 34. The output of reference counter 34 provides the second input to phase comparator 38. There is also a fixed divide by five connected to the output of the reference counter 34 (not shown). The purpose of this extra divide by five counter is to provide a stable crystal controlled reference frequency for microcomputer 24.

When the signal from variable counter 36 and the signal from reference counter 34 to phase comparator 38 are exactly equal, the comparator output is zero. When there is any difference in these two frequencies, the comparator 38 will develop an output which, when passed through PLL filter 54, provides a correction voltage to varactor tuner 21 to change the local oscillator frequency until the two signals have exactly the same frequency. The tuner oscillator 21 then assumes the stability of the crystal reference oscillator 46. This frequency comparison is done continually in order to compensate for tuner oscillator drift. In order for comparator 38 to operate correctly the divided down oscillator frequency should always be about equal to the other comparator input of about 1 KHz. Since the oscillator frequencies are different for each channel, a different divide ratio must be used for each selected channel. For example, to tune in channel 2 the local oscillator frequency of 101 MHz must be divided by 101,000 to yield a 1 KHz signal to the comparator while to obtain channel 13 the local oscillator frequency of 213 MHz must be divided by 213,000. The operation is performed by programmable divider 36 which is controlled by microcomputer 24. In all, eight inputs are provided to the PLL integrated circuit (IC) 22 by microcomputer 24 to control its operation. Four of these inputs are data lines which receive serial data of 4-bit parallel words for controlling the various dividers. Three other inputs are data steering lines which determine to which registers the data will be sent. The eighth input is an "Enable" line which permits microcomputer 24 to receive the correct data and exclude other information which may be present on the data line at different times.

The output of phase comparator 38 is a series of pulses the duty cycle of which is dependent on the difference between the reference frequency (1 KHz) and the divided down local oscillator frequency. These pulses are filtered by the active PLL filter circuit 54 resulting in a D.C. voltage with a negligible amount of 1 KHz ripple. No input pulse results in a high D.C. voltage and high duty cycle pulses result in a low D.C. voltage. Once the nominal tuning voltage is established, the circuit acts like a sample and hold circuit. Any of the more conventional active filter arrangements could be employed here in the AFT-wide automatic frequency control system without departing from the spirit of the present invention. However, a detailed description of the filter configuration utilized in the preferred embodiment of the present invention can be found in co-pending application Ser. No. 107,732, filed Feb. 19, 1980, entitled "Microcomputer-Controlled One-Step-Back Automatic Frequency Control Tuning System," in the name of Peter C. Skerlos.

Microcomputer 24 stores data, periodically updates this stored data, compares both stored and real-time data and makes decisions based upon these comparisons in providing system control. The microcomputer chip is of the MN 1400 series basic design as manufactured by the Matsushita Electronics Corporation which has been specially modified for the present application. The microcomputer 24 is a 4-bit, MOS unit with a ROM, a RAM, an arithmetic logic unit, input/output (I/O) ports, and a clock generator on a single semiconductor chip. Detailed information regarding microcomputer chip configuration and operation is contained in the Matsushita Electronics Corporation publication entitled "MN 1400 Series: 4-Bit One-Chip Microcomputer." While the Matsushita chip is utilized in the preferred embodiment of the present invention, there are a number of integrated circuits currently available which could be integrated for successful operation of the present invention with only minor modifications and their use would not depart from the spirit of the present invention.

Figure 2:
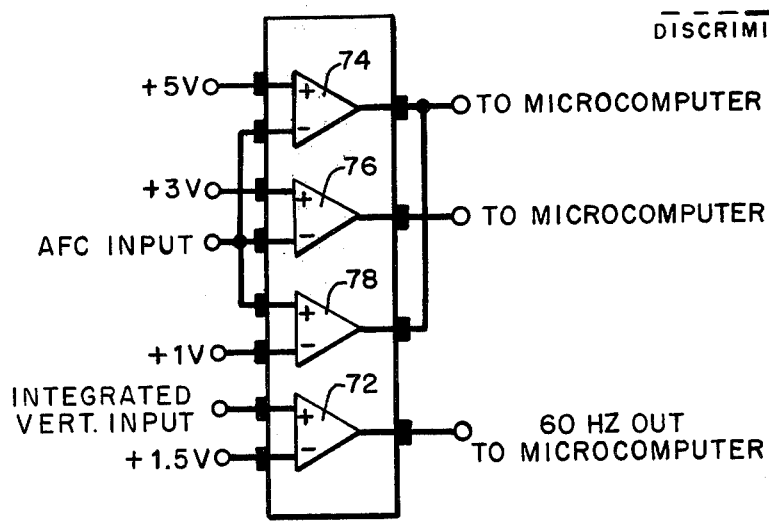
FIG. 2 shows the combination of the direction, window and vertical sync comparators utilized in tuning to the selected channel frequency in a preferred embodiment of the present invention.

Microcomputer 24 receives sensory input signals from the television chassis and output control signals via sensory circuitry 44 in the television receiver. The detailed data thus provided to microcomputer 24 is used for controlling the parameters of the phase lock loop 22. This information includes tuning frequency window (predetermined frequency range about the correct nominal frequency for a given channel), tuning frequency edge (tuning direction for tuning to a given channel's nominal frequency), the picture carrier, system timing and vertical synchronization. These input signals are processed and transformed into appropriate signals for driving microcomputer 24 by several comparators. This comparator configuration is shown in FIG. 2. The composite sync signal is passed through a low pass filter (not shown) to extract the vertical sync signal. This vertical sync signal is then passed through two comparators with only the vertical sync comparator 72 used for the seek mode. The vertical sync comparator 72 shapes up the vertical sync signal and converts it to the proper two level signal to drive microcomputer 24.

The present invention is concerned with the automatic frequency control of the television receiver's tuner and is not concerned with the overall control of the various television receiver components by the microcomputer. In the preferred embodiment of the present invention there are two tuning modes of operation. One is termed "NORMAL" which provides pure PLL operation. The other mode of operation is termed "SPECIAL" and in this mode microcomputer 24 initiates and executes a specially designed AFC routine. Television receiver operating mode is manually selectable between the "NORMAL" and "SPECIAL" modes by means of a control switch located on keyboard 28. This switch is not shown in FIG. 1 and may consist of any of the more commonly available electronic switching devices.

Figure 4:
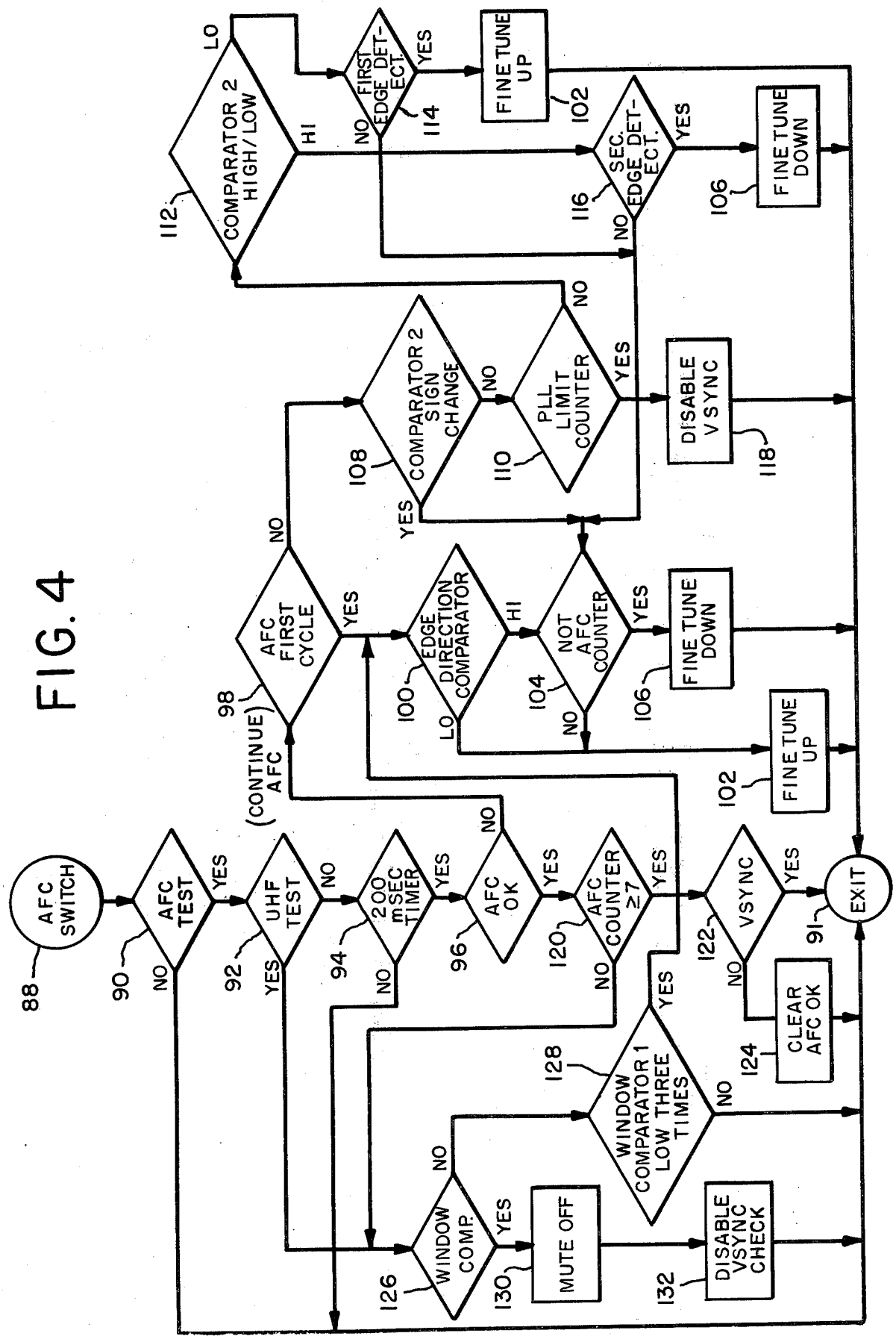
FIG. 4 shows the detailed AFC control routine utilized in the present invention.

The AFC program routine as executed in the microcomputer-controlled, AFT-wide automatic frequency control system is shown in detail in FIG. 4. FIG. 4 shows the manner in which digital signals are processed in controlling various tuner system components during AFC tuning in the present invention. In referring to FIG. 4, an oval symbol indicates the start of an operational sequence, a rectangle indicates an instruction or set of instructions resulting in the performance of a control function and a diamond indicates a decision point based upon the comparison of binary signal inputs.

The output of window comparators 74 and 78 shares a common load with the edge/direction comparator 76 as shown in FIG. 2. When a channel is selected, the system will first synthesize the correct frequency for that channel. The microprocessor 24 then looks at the output of the edge/direction comparator 76 to determine the direction of tuning. A high output indicates the need for tuning down. This process is illustrated in FIGS. 3A-3E where AFC voltages generated in response to various IF frequencies as they relate to the picture carrier (45.75 MHz) are shown together with the outputs of the various comparators utilized in this signal processing scheme. Once the proper tuning direction is determined by the edge/direction comparator 76 the microcomputer then steps the AFC tuning voltage in increments of 28 to 90 KHz, with the smaller increments used for tuning in lower channels and the larger increments used for tuning in higher channels, until the limit of the number of allowed steps for that particular channel is reached. When this limit is reached and no valid carrier is found, tuning is switched to the other limit and the voltage stepping procedure is initiated again. If the tuning voltage is being stepped up, the microcomputer looks for a low to high transition of the edge/direction comparator 76 or the opposite transition if tuning proceeds in the opposite direction. When a voltage transition is detected, with 3 volts coinciding with the picture carrier frequency of 45.75 MHz, voltage stepping ceases, a correction is made for overshooting the 3 volt AFC control voltage—45.75 MHz picture carrier nominal point and the validity of the carrier is then tested. For the carrier to be valid, the output of the window comparators, 74 and 78, should be high (AFC voltage between 1 and 5 volts) and the vertical sync comparator 72 should produce a train of 60 Hz pulses, indicating the presence of vertical sync information.

During the time that the system is acquiring the desired channel, the raster is blanked and the sound is muted. The correction made for overshooting the point of nominal stability on the AFC tuning curve, the 3 volt—45.75 MHz point, involves stepping the AFC voltage back to its value at the preceding step. This procedure of stepping the AFC tuning voltage back one increment permits the accurate tuning of channels operating on their designated frequency. As shown in FIG. 3B, direction information is provided by edge/direction comparator 76. The output of this comparator provides tuning information so as to permit accurate tuning to the nominally stable point of 3 volts AFC control voltage and 45.75 MHz picture carrier frequency. As shown in FIGS. 3C and 3D window information is provided by window comparators 74 and 78. As shown in FIG. 3E the output of these two window comparators is combined to provide window information in order to determine whether the tuning voltage is within the required tuning window. This tuning window extends from one volt to five volts. With these various inputs the microcomputer is able to determine whether to tune up or tune down.

The AFC program routine as executed in the microcomputer-controlled, AFT-wide automatic frequency control system and method is shown in greater detail in FIG. 4. In order for the AFC program to be initiated the AFC SELECTOR switch 88 must be engaged. The status of the AFC SELECTOR switch 88 is continually scanned by microcomputer 24 resulting in the setting of the AFC flag test 90 if the AFC SELECTOR switch 88 is engaged. If the AFC SELECTOR switch 88 is engaged, the AFC routine proceeds to UHF flag test 92. If the AFC SELECTOR switch 88 is not engaged, the program continues to the EXIT POINT 91 where it re-enters the general tuner program. If the output of the UHF flag test 92 is one, the program proceeds to WINDOW COMPARATOR flag test 126. If the output of the UHF flag test 92 is 0, the program proceeds to a 200 millisecond TIMER flag test 94 which provides a 200 millisecond settling time for the AFC system components prior to tuning. If the 200 millisecond period has not elapsed the output 200 millisecond TIMER test flag 94 is 0 and the program routes to the EXIT POINT 91 and then to the remainder of the tuner program. If the 200 millisecond period has elapsed, the program moves to the AFC OK test flag 96 which monitors the status of the AFC system. The AFC program periodically reads a 60 Hz timing signal and the microcomputer monitors transitions of the 60 Hz wave form with these transitions establishing system timing. If the output of the AFC OK test flag 96 is 0, the program proceeds to the AFC FIRST CYCLE test flag 98 to determine if this is the first execution of the AFC program. If it is the first execution of the AFC program, the program proceeds to the EDGE/DIRECTION COMPARATOR test flag 100 where the tuning voltage is compared with a 3 volt nominal tuning voltage. By means of the EDGE/DIRECTION COMPARATOR test flag 100 the decision is made as to whether to fine tune up or fine tune down. Fine tune up is controlled by the FINE TUNE UP CONTROLLER 102 while fine tune down is controlled by the FINE TUNE DOWN CONTROLLER 106. If the output of the EDGE/DIRECTION COMPARATOR test flag 100 is 1 in which case fine tuning must be in a downward direction, the program proceeds to the NOT AFC test flag 104 where the program determines whether to fine tune up or down based upon other computing data provided by sources other than the EDGE/DIREC- TION COMPARATOR test flag 100 and which may indicate a tuning direction opposite to that indicated by the EDGE/DIRECTION COMPARATOR test flag 100. In this manner the NOT AFC counter 104 acts as a defeat of normal fine tuning program procedures.

Figure 3A:
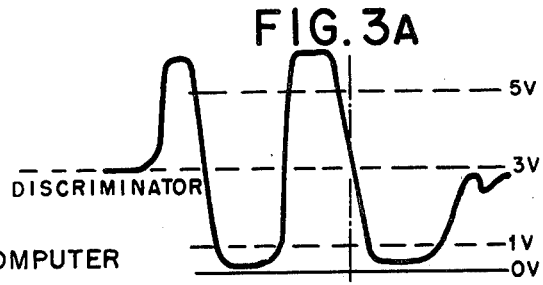
FIGS. 3A–3E illustrate the operating characteristics of the microcomputer-controlled, AFT-wide automatic frequency control system and method described herein where the intermediate frequency is shown as a function of the AFC tuning voltage together with the outputs of the various comparators utilized in signal processing.
Figure 3B:
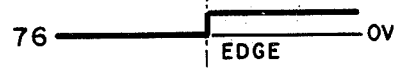
Figure 3C:
Figure 3D:
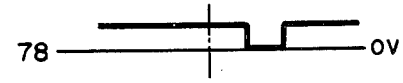
Figure 3E:

As can be seen in FIG. 3A, in some situations information in addition to tuning direction and window information is needed to correctly tune along the AFC tuning voltage curve to accurately tune in the nominal picture carrier frequency of 45.75 MHz. Whether a fine tuning up or fine tuning down adjustment is made, the program then proceeds to the EXIT POINT 91. If the AFC FIRST CYCLE test flag 98 indicates that the system is not in a first AFC cycle the program then proceeds to the EDGE/DIRECTION COMPARATOR SIGN CHANGE test flag 108. The EDGE/DIRECTION COMPARATOR SIGN CHANGE test flag 108 compares the current sign of the AFC FIRST CYCLE test flag 98 with its previous sign and detects a change of state. If a sign change is detected by the EDGE/DIRECTION SIGN CHANGE test flag 108, the program proceeds to the NOT AFC counter 104, looks for other tuning data other than from the AFC tuning routine and tunes up or down as required. The NOT AFC counter 104 looks carefully at edge information as applicable to the AFC tuning voltage curve shown in FIG. 3A. If no sign change is detected by the EDGE/DIRECTION COMPARATOR SIGN CHANGE test flag 108 the program proceeds to the PLL LIMIT counter 110 which determines if the PLL high or low limits have been exceeded. If the phase lock loop limits have been exceeded, the program proceeds to the DISABLE VERTICAL SYNC control 118 and then proceeds to the EXIT POINT 91. If the phase lock loop limits have not been exceeded as determined by the PLL LIMIT counter 110, the program proceeds to the EDGE/DIRECTION COMPARATOR HIGH/LOW test flag 112. If the EDGE/DIRECTION COMPARATOR HIGH/LOW test flag 112 detects a low output the program proceeds to a FIRST EDGE DETECTOR test 114. If the output of the FIRST EDGE DETECTOR test 114 indicates the presence of an edge the system fine tunes up by means of the FINE TUNE UP control 106 and then proceeds to the EXIT POINT 91. If the output of the FIRST EDGE DETECTOR test 114 indicates the absence of an edge the system proceeds to the NOT AFC test flag 104 and fine tunes either up or down accordingly. If the output of the EDGE/DIRECTION COMPARATOR HIGH/LOW test flag 112 indicates a high output the program proceeds to a SECOND EDGE DIRECTOR test 116. If the SECOND EDGE DETECTOR test 116 senses an edge indicating a transition from low to high the program proceeds to a FINE TUNE DOWN controller 102 by means of which the frequency is tuned down. If the output of the SECOND EDGE DETECTOR test 116 indicates a low output from the EDGE/DIRECTION COMPARATOR HIGH/LOW test flag 112, the program proceeds to the NOT AFC test flag 104 and fine tunes up or down as required.

The output of the EDGE/DIRECTION COMPARATOR HIGH/LOW test flag 112 indicates the current tuning state so that if the FIRST EDGE DETECTOR test flag 114 indicates the presence of an edge, the system has transitioned from a high to a low tuning state resulting in a tuning adjustment by the FINE TUNE UP controller 106. This tuning direction reversal is equivalent to a one step backward adjustment in the incrementally stepped tuning voltage in order to more accurately tune to the desired channel. A similar one step backward tuning adjustment is made by the FINE TUNE DOWN controller 102 if the output of the EDGE/DIRECTION COMPARATOR HIGH/LOW test flag 112 is high and the SECOND EDGE DETECTOR 116 detects the presence of an edge. In this manner the program provides for accurate fine tuning to the desired channel.

The AFC OK test flag 96 is reset to 0 whenever any one of the following three conditions occurs:
  (1) when a new channel is selected,
  (2) when the AFC is turned Off, or
  (3) when the window and/or vertical synchronization is lost for three AFC cycles in a row. If the output of the AFC OK test flag 96 indicates that it is not engaged in the first AFC cycle, the program proceeds to the AFC 7 OK test flag 120. The AFC 7 OK test flag 120 detects how many times the AFC routine has been cycled through. If the number of cycles is greater than or equal to seven the program proceeds to the VERTICAL SYNC test flag 122. The VERTICAL SYNC test flag 122 senses the status of the reception of the vertical sync signal and if the vertical sync signal is being received the program proceeds to the EXIT POINT 91. If the vertical sync signal is not being properly received as indicated by the output of the VERTICAL SYNC test flag 122, the program proceeds to the CLEAR AFC OK flag test 124 which resets the AFC OK flag. The status of the AFC OK flag is then checked the next time the AFC is initiated by the AFC OK flag test 96. If the AFC 7 OK flag test 120 indicates that the AFC routine has not proceeded through 7 or more cycles, the program proceeds to the WINDOW COMPARATOR flag test 126 which determines if the AFC tuning voltage is between 1 and 5 volts. If the presence of the window is not detected the program proceeds to the WINDOW COMPARATOR LOW THREE TIMES flag test 128. If the result of this test indicates the window has not been low three times then the program branches to the EXIT POINT 91. If the WINDOW COMPARATOR LOW THREE TIMES flag test 128 indicates that the window has been low three times then the program branches to the EDGE/DIRECTION COMPARATOR flag test 100. From here the program either fine tunes up or down as required or utilizes NOT AFC flag test 104 tuning information in tuning to the selected channel.

If the output of the WINDOW COMPARATOR flag 126 indicates the presence of the tuning window the program proceeds to the MUTE OFF control 130 which turns the sound off during automatic fine tuning and turns it back on after automatic fine tuning is completed. FROM THE MUTE OFF control 130 the program proceeds to the DISABLE VERTICAL SYNC control 132 and then proceeds to the EXIT POINT 91 and the remaining portion of the tuning program. The computer listing for the AFC tuning process shown in FIG. 4 is presented in Table 1. Contained in this program assembly listing is such information as memory addresses, object code, statement number and additional source statement information. Detailed information on the symbology used in Table 1 is contained in the publication "MN 1400 Series: 4-Bit 1-Chip Microcomputer", published by Matsushita Electronics Corporation.

Shown in FIG. 5 is the AFC discriminator curve characteristic of the present invention in which the disciminator output voltage is presented as a function of the tuned intermediate frequency. As can be seen from the S-shape of this tuning curve, it is possible for the tuner to be tuned to various frequencies at the nominal discriminator output voltage value of 3 volts. Thus, without the present invention, an indirect frequency synthesis tuning system could be locked out from receiving the nominal IF video signal at 45.75 MHz. The present invention, however, permits the television receiver tuning system to detect and correct an ambiguous tuning state. Thus, the present invention will initiate a frequency-stepping process following the initial frequency synthesis by means of the tuning voltage.

The initial frequency-stepping direction will be determined as previously described by means of the edge, or direction, and window comparators, 74, 76 and 78. The system will thus incrementally adjust the discriminator output voltage so as to approach the 45.75 MHz nominal IF picture carrier frequency shown in FIG. 5 as point A. Thus, if initially at point B the system will decrease discriminator output voltage so as to incrementally approach point A on the AFC discriminator curve. If initially tuned to point C along this curve, the system will incrementally increase AFC discriminator output voltage so as to approach the nominal picture carrier frequency at point A.

TABLE 1

| LOC | OBJ | STMT | SOURCE | STATEMENT | | |
|---|---|---|---|---|---|---|
| 0491 | 98 | 1057 | | CI | 8 | NOT 1ST TIME XX01,XX10,0R00XX |
| 0492 | E2AA | 1058 | | BNZ | 8X30 | |
| 0494 | C8 | 1059 | | RM | 8 | |
| 0495 | 15 | 1060 | | INB | | |
| 0496 | 6C | 1061 | 8Y2 | LY | 12 | |
| 0497 | D4 | 1062 | | TB | 4 | COMP 2 CHECK |
| 0498 | 63AC | 1063 | | BZ | SX20 | |
| 049A | B3 | 1064 | 3X10 | SM | 3 | COMP 2 HIGH |
| 049B | 0D | 1065 | 8I60 | L | | |
| 049C | D1 | 1066 | | TB | 1 | |
| 049D | E3A5 | 1067 | | B7 | 8150 | |
| 049F | 31 | 1068 | LX | 1 | | |
| 04A0 | 4F1E | 1069 | | CAL | FTON | |
| 04A2 | 413C | 1070 | | JMP | SYSC1 | |
| 04A4 | C3 | 1071 | SX20 | RM | 3 | COMP2 LOW |
| 04A5 | 31 | 1072 | 3150 | LX | 1 | |
| 04A6 | 4F05 | | CAL | FTUP | | |
| 04A6 | 413C | 1074 | | JMP | SYSC1 | |
| 04AA | DC | 1075 | 9X30 | TB | 12 | SIGN OF COMP 2 CHANGED LAST TIME |
| 04AB | E3B1 | 1076 | | BZ | 3X50 | |
| 04AD | 84 | 1077 | | AT | 4 | |
| 04AE | 0A | 1078 | | ST | | |
| 04aF | 449B | 1079 | | JMP | 3I60 | |
| 04B1 | 31 | 1080 | 3X50 | LX | 1 | AFC CYCLE COMPLETE? |
| 04B2 | 67 | 1081 | | LY | 7 | |
| 04B3 | 0E | 1082 | | LIC | | |
| 04B4 | 93 | 1083 | | CI | 3 | |
| 04B5 | E28B | 1034 | | BNZ | 3X51 | |
| 04B7 | 0D | 1085 | | L | | |
| 04B8 | 95 | 1086 | | CI | 5 | |
| 04B9 | E383 | 1087 | | BZ | SY4 | |
| 04BB | 30 | 1088 | SX51 | LX | 0 | |
| 04BC | 6C | 1089 | | LY | 12 | |
| 04BD | 15 | 1090 | | INB | | |
| 04BE | D4 | 1091 | | TB | 4 | |
| 04BF | E3CD | 1092 | | BZ | SX60 | COMP 2 CHECK |
| 04C1 | 0D | 1093 | | L | | COMP 2HIGH |
| 04C2 | B2 | 1094 | | SM | 2 | |
| 04C3 | 90 | 1095 | | CI | 0 | COMP 2HIGH |
| 04C4 | E29B | 1096 | | BNZ | SI60 | |
| 04C6 | B4 | 1097 | | SM | 4 | EDGE DTECTED |
| 04C7 | 6D | 1098 | | LY | x'D' | |
| 04CB | B3 | 1099 | | SM | 3 | |
| 04C9 | 449F | 1100 | | JMP | SI40 | |
| 04CB | 0D | 1101 | SX60 | L | | COMP 2 LOW |
| 04CC | 93 | 1102 | | CI | 3 | |
| 04CD | C2 | 1103 | | RM | 2 | |
| 04CE | E29B | 1104 | | BNZ | SI60 | |
| 04D0 | B4 | 1105 | | SM | 4 | EDGE DETECTED |
| 04D1 | 6D | 1106 | | LY | X'D' | |
| 04D2 | B3 | 1107 | | SM | 3 | |
| 0456 | 31 | 1009 | SI00 | LX | 0 | |
| 0457 | 20 | 1010 | | LD | 1 | MODE CHECK |
| 0458 | 79 | 1011 | | ANDI | 9 | |
| 0459 | 91 | 1012 | | CI | 1 | |
| 045A | E287 | 1013 | | BNZ | CEND1 | |
| 045C | 21 | 1014 | | LD | 1 | AFC MODE & AFTER 220MSEC |
| 045D | D8 | 1015 | | TB | 8 | |
| 045E | E270 | 1016 | | BNZ | 8Y0 | |
| 0460 | 6F | 1017 | SI01 | LY | X'E' | WITHOUT UHF----AFC ENABLE |
| 0461 | 0D | 1018 | | L | | |
| 0462 | 81 | 1019 | | AT | 1 | |
| 0463 | 0A | 1020 | | S7 | | |
| 0464 | E487 | 1021 | | BNC | CEND1 | |

TABLE 1-continued

| LOC | OBJ | STMT | SOURCE | STATEMENT | | |
|---|---|---|---|---|---|---|
| 0466 | BF | 1022 | | SM | 15 | 20MSEC PRESET FOR VXYNC CHECK |
| 0467 | 30 | 1023 | SI100 | LX | 0 | AFC TIMING------SENSOR DETECTION |
| 0468 | 6D | 1024 | | LY | X'D' | |
| 0469 | 0D | 1025 | | L | | AFC OK CHCK |
| 046A | E38F | 1026 | | BZ | SI30 | |
| 046C | 2E | 1027 | | ICM | | |
| 046D | 96 | 1028 | | CI | 6 | |
| 046E | E578 | 1029 | | BC | SY0 | |
| 0470 | 6F | 1030 | | LY | 15 | VSYNC CHECK FOR 120MB |
| | | 1031 | * | | | M(0,D) 4,5,6 |
| 0471 | D8 | 1033 | | TB | 8 | |
| 0473 | E387 | 1034 | | BZ | CEND1 | |
| 0475 | 50 | 1035 | | LI | 0 | CLEAR M(0,D) |
| 0476 | 4484 | 1036 | | JMP | SY1 | |
| 0478 | 99 | 1037 | SY0 | CI | 9 | SET CF IF M(0,D) OR >9 |
| 0479 | 62 | 1038 | | LY | 2 | |
| 047A | 17 | 1039 | | SCO | | WINDOW SCAN ON |
| 047B | C0 | 1040 | | RM | 0 | |
| 047C | 15 | 1041 | | IMB | | |
| 047D | 16 | 1042 | | RCO | | WINDOW SCAN OFF |
| 047E | D8 | 1043 | | TB | 8 | COMP 1 CHECK |
| 047F | E389 | 1044 | | BZ | SY3 | |
| 0481 | 4A96 | 1045 | | CAL | MTOF | JUST TUNE |
| 0483 | 57 | 1046 | SY4 | LI | 7 | DISABLE VSYNC CHECK |
| 0484 | 30 | 1047 | SY1 | LX | 0 | |
| 0485 | 6D | 1048 | | LY | X'D' | |
| 0486 | 0A | 1049 | | ST | | |
| 0487 | 413C | 1050 | CEND1 | JMP | SYSC1 | |
| 0489 | E487 | 1051 | SY3 | BNC | CEND1 | COMP 1 LOW 3 TIMES CONTINUOUSLY? |
| 048B | 2F | 1053 | | DCM | X'D' | FINE TUNE AGAIN |
| 048D | 4496 | 1054 | | JMP | SY2 | |
| 048F | 6C | 1055 | SI30 | LY | 12 | |
| 0490 | 0D | 1056 | | L | | |

However, following initial frequency synthesis the system may find itself offset from point A, for example, at point I. In this case edge and window comparator outputs will indicate no need for a tuning change and the system wil remain de-tuned, or tuned to a spurious signal. Similarly at point F on the AFC discriminator curve the comparator outputs would indicate a properly tuned situation while, in fact, the system would be offset from the nominal IF picture carrier frequency by more than 3 MHz.

Points E and D correspond respectively to points B and C on the AFC discriminator curve for purposes of edge and window comparator tuning outputs. In the absence of the present invention, a system initially tuned to either point E or point D, or any frequency therebetween, would attempt to adjust its frequency to that of point F and not seek to tune to the nominal picture carrier frequency at point A. This action would be based on the outputs of the edge and window comparators and would lead to a grossly mistuned situation. The present invention, however, eliminates this anomalous situation by looking for proper vertical sync following the AFC frequency-stepping process. Thus the AFT-wide automatic frequency control system of the present invention steps the frequency downward along the AFC discriminator curve in approaching point A. If comparator outputs indicate proper edge and window information, the system verifies proper signal lock-on by detecting vertical sync. The absence of vertical sync causes the system to continue frequency-stepping until all three conditions for verifying proper tuning have been met. Thus, the system frequency-steps along the AFC discriminator curve toward point G and, if point A has not been passed in this process, the system upon reaching the lower limits of the phase lock loop tuning frequency range designated in FIG. 5 is point G will return to the upper limit designated by point H. Following this oscillator jump the system automatically allows for tuner stabilization by introducing an 80 millisecond delay before re-initiation of the frequency-stepping procedure.

The phase lock loop limits are detected by PLL LIMIT COUNTER 110 of the AFC program routine as shown in FIG. 4. At this point the program routine looks for a low PLL frequency tuning limit and, if detected, initiates a frequency jump to the upper PLL limit. As shown in FIG. 4 detection of the lower PLL limit results in the disabling of the VERTICAL SYNC DETECTOR 118 and an exiting from the program. When the AFC program is next called up as part of the overall channel tuning program, the AFC subroutine is re-initiated and, following AFC test 90 and UHF test 92, incorporates the 80 millisecond time delay to permit system stabilization. As shown in FIG. 4 this timing delay is initially 200 milliseconds following initial channel selection, but is reduced automatically via microcomputer control to 80 milliseconds once a particular channel is selected and the AFT-wide automatic frequency control subroutine is subsequently executed.

The polarity reversal of edge/direction comparator 76 and window comparators 74 and 78 is shown in FIG. 6 by the broken and solid curves, respectively. Various points on these curves are designated by letters A through H and correspond respectively with similar points on the AFC discriminator curve of FIG. 5. Polarity reversal information is provided to the microcomputer in the frequency-stepping process to permit detection of voltage and frequency transitions from which more accurate tuning information can be assessed. Thus, for example, FIG. 6 shows that passage of point A in FIG. 5 will be reflected in a polarity change in edge/detection comparator 76 which would change its output from 0 to 5 volts by virtue of the frequency stepping process through point A from a higher to lower frequency. If this procedure is initiated from the vicinity of point B on the AFC discriminator curve the polarity change of edge/direction comparator 76 as a result of crossing point A would be from +5 volts to 0 volts as shown in FIG. 6. FIG. 6, in combination with FIG. 5, also shows that within the discriminator output voltage range of 1 to 5 volts the window comparators 74 and 78 will provide a 5 volt output. Outside this voltage range the output of these comparators to the tuner will be 0 volts. Another approach to a microcomputer-controlled AFC system utilizing a signal comparator configuration is disclosed in "A Microcomputer Controlled Frequency Synthesizer for TV," IEEE Transactions on Consumer Electronics, Vol. CE-24, No. 2, May 1978, by Rzeszewski et al.

There has thus been shown an AFT-wide automatic frequency control system and method which permits more accurate channel frequency tuning in a television receiver. Ambiguous conditions resulting from the characteristics of the AFC tuning curve are resolved by providing tuning direction, tuning window and vertical synchronization information to a microcomputer which controls the tuner's local oscillator in tuning to the selected channel.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A wide-band automatic fine tuning system for tuning a television receiver to the carrier frequency of a received television signal having at least a picture carrier component and a synchronizing signal component, said television receiver including radio frequency receiving means, variable frequency tunable means coupled to said receiving means for receiving said radio frequency signal, said tunable means including a voltage control oscillator for generating an intermediate frequency signal when combined with said received television signal, intermediate frequency signal amplification means coupled to said tunable means for amplifying said intermediate frequency signal, automatic frequency control means including discriminator means connected to an output of said intermediate frequency amplifier means for generating a plurality of first output signals characteristic of said received television signal and synchronizing signal component sensing means for providing a predetermined plurality of second output signals when said synchronizing components are in proper relationship with said picture carrier component of said received television signal, said automatic fine tuning system comprising:
   signal processing means for receiving said automatic frequency control first output signals and said predetermined second output signals from said synchronization signal component sensing means and for comparing said signals to predetermined automatic frequency control tuning curve characteristics representing a nominal intermediate frequency of said picture carrier component and a predetermined synchronization condition, respectively, and for generating a plurality of third output signals in response to said comparisons;
   phase lock loop means coupled to the voltage controlled oscillator of said tunable means for comparing the frequency of said voltage controlled oscillator with a standard frequency signal source by means of a phase detector and for generating a first control signal for controlling the frequency of said voltage controlled oscillator; and
   control means coupled to said signal processing means for generating second control signals in response to said third output signals, said control means being coupled to said tunable means and to said phase lock loop means for providing said second control signals to said tunable means and said phase lock loop means in automatically fine tuning said television receiver to said received television signal.

2. The wide-band automatic fine tuning system of claim 1 wherein said signal processing means include:
   first signal discriminator means for determining if said intermediate frequency signal is within a restricted frequency range or window about the frequency of said nominal intermediate frequency, said frequency range being defined by an upper and a lower limit; and
   second signal discriminator means for determining if said intermediate frequency signal is greater or less than said nominal intermediate frequency and the direction in which said tunable means must be adjusted in automatically fine tuning said television receiver to said received television signal.

3. The wide-band automatic fine tuning system of claim 2 wherein said second control signals include bandswitch signals provided to said tunable means and tuning voltage signals provided to said phase lock loop means.

4. The wide-band automatic fine tuning system of claim 3 wherein said control means includes voltage stepping means for incrementally adjusting said tuning voltage signals in automatically fine tuning in a stepwise manner said television receiver to said received television signal.

5. The wide-band automatic fine tuning system of claim 4 wherein the size of said tuning voltage steps and resulting voltage controlled oscillator frequency increments increase with increasing frequency of the received television signal.

6. The wide-band automatic fine tuning system of claim 5 wherein the incremental adjustment of said tuning voltage signals ceases when said nominal picture carrier frequency is passed.

7. The wide-band automatic fine tuning system of claim 6 further comprising means for detecting when a first predetermined low frequency tuning limit is reached in incrementally adjusting the frequency of said voltage controlled oscillator and for automatically incrementing the frequency of said voltage controlled oscillator to a second predetermined high frequency tuning limit thereby continuing said frequency-stepping tuning adjustments.

8. The wide-band automatic fine tuning system of claim 7 wherein said control means is a microcomputer including memory means for storing said incremental tuning voltage adjustment values and means for reading from said memory means stored incremental adjustments in response to the receipt by said microcomputer of said third output signals.

9. A wide-band automatic fine tuning system for tuning a television receiver to the carrier frequency of a received television signal having at least a picture carrier component and a synchronizing signal component, said television receiver including radio frequency receiving means, variable frequency tunable means coupled to said receiving means for receiving said radio frequency signal, said tunable means including a voltage controlled oscillator for generating an intermediate frequency signal when combined with said received television signal, intermediate frequency signal amplification means coupled to said tunable means for amplifying said intermediate frequency signal, automatic frequency control means including discriminator means connected to an output of said intermediate frequency amplifier means for generating a plurality of first output signals characteristic of said received television signal and synchronizing signal component sensing means for providing a predetermined plurality of second output signals when said synchronizing components are in proper relationship with said picture carrier component of said received television signal, said automatic fine tuning system comprising:

signal processing means for receiving said automatic frequency control first output signals and said predetermined second output signals from said synchronization signal component sensing means and for comparing said signals to predetermined automatic frequency control tuning curve characteristics representing a nominal intermediate frequency of said picture carrier component and a predetermined synchronization condition, respectively, and for generating a plurality of third output signals in response to said comparisons, said signal processing means including:

first signal discriminator means for determining if said intermediate frequency signal is within a restricted frequency range, or window, about the frequency of said nominal intermediate frequency, said frequency range being defined by an upper and a lower limit; and second signal discriminator means for determining if said intermediate frequency signal is greater or less than said nominal intermediate frequency and the direction in which said tunable means must be adjusted in tuning to said received television signal;

phase lock loop means coupled to the voltage controlled oscillator of said tunable means for comparing the frequency of said voltage controlled oscillator with a standard frequency signal source by means of a phase detector and for generating a first control signal for controlling the frequency of said voltage controlled oscillator; and control means coupled to said signal processing means for generating second control signals in response to said third output signals, said control means being coupled to said tunable means and to said phase lock loop means with said second control signals including bandswitch signals provided to said tunable means and tuning voltage signals provided to said phase lock loop means in automatically fine tuning said television receiver to said received television signal.

10. The wide-band automatic fine tuning system of claim 9 wherein said control means includes voltage stepping means for incrementally adjusting said tuning voltage signals provided to said phase lock loop means producing step-wise adjustments to said first control signals provided to said tunable means in automatically fine tuning in a step-wise manner said television receiver to said received television signal.

11. A method for automatically fine tuning a television receiver to the carrier frequency of a received television signal having at least a picture carrier component and a synchronizing signal component, comprising:

combining said received television signal with a variable frequency signal to produce an intermediate frequency signal;

amplifying said intermediate frequency signal;

comparing said intermediate frequency signal with a nominal intermediate frequency signal and generating first output signals based upon said comparison, said nominal intermediate frequency signal representing a predetermined tuning voltage on an automatic frequency control tuning curve of said television receiver with said first output signals indicating:

that said intermediate frequency signal is within a restricted frequency range, or window, about the frequency of said nominal intermediate frequency, said frequency range being defined by an upper and a lower limit; and that said intermediate frequency signal is greater or less than said nominal intermediate frequency and the direction in which said intermediate frequency signal must be adjusted to coincide with said nominal intermediate frequency signal;

detecting the presence of said synchronizing signal component and generating second output signals when said synchronizing signal component is in proper relationship with said picture carrier component of said received television signal;

generating a plurality of third output signals in response to said first and second output signals; and adjusting said variable frequency signal by means of said third output signals so as to match the frequencies of said intermediate frequency signal and said nominal intermediate frequency signal in automatically fine tuning said television receiver to the carrier frequency of said received television signal.

12. The method of claim 11 wherein the step of adjusting said variable frequency signal is performed in a step-wise manner such that said intermediate frequency signal approaches said nominal intermediate frequency signal incrementally with the frequency stepping process terminating when the two frequencies coincide.

13. The method of claim 12 further comprising the steps of:

detecting when a first predetermined low frequency tuning limit is reached in incrementally adjusting said variable frequency signal;

automatically incrementing the frequency of said variable frequency signal to a second predetermined high frequency tuning limit; and resuming the frequency stepping process from said high frequency limit to said low frequency limit.

14. The method of claim 13 further comprising the steps of:

comparing said variable frequency signal with a standard frequency source by means of a phase comparator; and locking said variable frequency signal on to the signal of said standard frequency source.

15. The method of claim 11 wherein said third output signals include bandswitch signals and tuning voltage signals.

16. A method for automatically fine tuning a television receiver to the carrier frequency of a received television signal having at least a picture carrier component and a synchronizing signal component, comprising:

combining said received television signal with a variable frequency signal to produce an intermediate frequency signal;

amplifying said intermediate frequency signal;

comparing said intermediate frequency signal with a nominal intermediate frequency signal and generating first output signals based upon said comparison, said nominal intermediate frequency signal representing a predetermined tuning voltage on an automatic frequency control tuning curve of said television receiver with said first output signals indicating:

that said intermediate frequency signal is within a restricted frequency range, or window, about the frequency of said nominal intermediate frequency, said frequency range being defined by an upper and a lower limit; and that said intermediate frequency signal is greater or less than said nominal intermediate frequency and the direction in which said intermediate frequency signal must be adjusted to coincide with said nominal intermediate frequency signal;

detecting the presence of said synchronizing signal component and generating second output signals when said synchronizing signal component is in proper relationship with said picture carrier component of said received television signal;

generating a plurality of third output signals in response to said first and second output signals, said third output signals including bandswitch signals and tuning voltage signals;

adjusting said variable frequency signal by means of said third output signals so as to match the frequencies of said intermediate frequency signal and said nominal intermediate frequency signal, said variable frequency adjusting being performed in a stepwise manner such that said intermediate frequency signal approaches said nominal intermediate frequency signal incrementally with the frequency stepping process terminating when the two frequencies coincide;

detecting when a first predetermined low frequency tuning limit is reached in incrementally adjusting said variable frequency signal;

automatically incrementing the frequency of said variable frequency signal to a second predetermined high frequency tuning limit; and resuming the frequency stepping process from said high frequency limit to said low frequency limit in automatically fine tuning said television receiver to the carrier frequency of said received television signal.

* * * * *